(12) United States Patent
Bellorado et al.

(10) Patent No.: US 11,361,788 B2
(45) Date of Patent: Jun. 14, 2022

(54) DATA PATH DYNAMIC RANGE OPTIMIZATION

(71) Applicant: Seagate Technology LLC, Cupertino, CA (US)

(72) Inventors: Jason Bellorado, San Jose, CA (US); Marcus Marrow, San Jose, CA (US); Zheng Wu, San Jose, CA (US)

(73) Assignee: Seagate Technology LLC, Fremont, CA (US)

(*) Notice: Subject to any disclaimer, the term of this patent is extended or adjusted under 35 U.S.C. 154(b) by 45 days.

(21) Appl. No.: 16/672,718

(22) Filed: Nov. 4, 2019

(65) Prior Publication Data

US 2020/0065262 A1    Feb. 27, 2020

Related U.S. Application Data

(63) Continuation of application No. 15/729,139, filed on Oct. 10, 2017, now Pat. No. 10,496,559.

(Continued)

(51) Int. Cl.
*G11B 5/596* (2006.01)
*G11B 20/10* (2006.01)
(Continued)

(52) U.S. Cl.
CPC ............ *G11B 5/59666* (2013.01); *G06F 1/08* (2013.01); *G06F 1/12* (2013.01); *G06F 13/102* (2013.01);
(Continued)

(58) Field of Classification Search
CPC ...... G06F 13/4221; G06F 13/102; G06F 1/08; G06F 1/12; G11B 5/59666;
(Continued)

(56) References Cited

U.S. PATENT DOCUMENTS 5,461,644 A   10/1995   Bermans et al.
5,621,769 A    4/1997   Wan et al.
(Continued)

OTHER PUBLICATIONS

Guo, Yuanbin, "An Efficient Circulant MIMO Equalizer for CDMA Downlink: Algorithm and VLSI Architecture", Hindawi Publishing Corporation, 2006, pp. 1-18.
(Continued)

*Primary Examiner* — Nimesh G Patel
(74) *Attorney, Agent, or Firm* — Kirk A. Cesari; Christian W. Best

(57) ABSTRACT

Systems and methods are disclosed for full utilization of a data path's dynamic range. In certain embodiments, an apparatus may comprise a circuit including a first filter to digitally filter and output a first signal, a second filter to digitally filter and output a second signal, a summing node, and a first adaptation circuit. The summing node combine the first signal and the second signal to generate a combined signal at a summing node output. The first adaptation circuit may be configured to receive the combined signal, and filter the first signal and the second signal to set a dynamic amplitude range of the combined signal at the summing node output by modifying a first coefficient of the first filter and a second coefficient of the second filter based on the combined signal.

20 Claims, 11 Drawing Sheets

Related U.S. Application Data

(60) Provisional application No. 62/522,248, filed on Jun. 20, 2017.

(51) Int. Cl.

| | | |
|---|---|---|
| *G06F 13/10* | (2006.01) | |
| *G06F 13/42* | (2006.01) | |
| *G06F 1/08* | (2006.01) | |
| *G06F 1/12* | (2006.01) | |
| *H04L 25/03* | (2006.01) | |
| *H03L 7/093* | (2006.01) | |
| *H03L 7/095* | (2006.01) | |
| *H03L 7/07* | (2006.01) | |
| *H03L 7/081* | (2006.01) | |
| *H03L 7/091* | (2006.01) | |
| *H04L 7/00* | (2006.01) | |
| *H04L 7/033* | (2006.01) | |
| *H03K 5/131* | (2014.01) | |
| *H03M 1/00* | (2006.01) | |
| *H03M 13/41* | (2006.01) | |
| *H03K 5/135* | (2006.01) | |
| H03G 3/20 | (2006.01) | |
| H03M 1/12 | (2006.01) | |
| H03M 13/29 | (2006.01) | |
| H04B 1/7105 | (2011.01) | |
| H03K 5/00 | (2006.01) | |

(52) U.S. Cl.
CPC ...... *G06F 13/4221* (2013.01); *G11B 5/59633* (2013.01); *G11B 20/1024* (2013.01); *G11B 20/10037* (2013.01); *G11B 20/10055* (2013.01); *G11B 20/10222* (2013.01); *H03K 5/131* (2013.01); *H03K 5/135* (2013.01); *H03L 7/07* (2013.01); *H03L 7/0814* (2013.01); *H03L 7/091* (2013.01); *H03L 7/093* (2013.01); *H03L 7/095* (2013.01); *H03M 1/001* (2013.01); *H03M 13/4146* (2013.01); *H04L 25/03019* (2013.01); H03G 3/20 (2013.01); H03K 2005/00019 (2013.01); H03M 1/12 (2013.01); H03M 13/2951 (2013.01); H04B 1/71055 (2013.01); H04L 7/0025 (2013.01); H04L 7/0029 (2013.01); H04L 7/0331 (2013.01)

(58) Field of Classification Search
CPC .......... G11B 20/10055; G11B 5/59633; G11B 20/10037; G11B 20/1024; G11B 20/10222; H03L 7/093; H03L 7/095; H03L 7/07; H03L 7/0814; H03L 7/091; H04L 25/03019; H04L 7/0029; H04L 7/0025; H04L 7/0331
See application file for complete search history.

(56) References Cited

U.S. PATENT DOCUMENTS

| | | | |
|---|---|---|---|
| 5,862,192 A | | 1/1999 | Huszar et al. |
| 6,111,712 A | | 8/2000 | Vishakhadatta et al. |
| 6,181,213 B1 | | 1/2001 | Chang |
| 6,396,887 B1 | | 5/2002 | Ware et al. |
| 6,438,185 B1 | | 8/2002 | Huttunen |
| 6,519,107 B1 | | 2/2003 | Ehrlich et al. |
| 6,549,587 B1 | | 4/2003 | Li |
| 6,581,182 B1 | | 6/2003 | Lee |
| 7,085,330 B1 | | 8/2006 | Shirali |
| 7,133,239 B1 | | 11/2006 | Hartman et al. |
| 7,324,561 B1 | * | 1/2008 | Miller ............... H03K 5/08 |
| | | | 331/182 |
| 7,333,280 B1 | * | 2/2008 | Lifchits ............... G11B 5/596 |
| | | | 360/51 |
| 7,440,208 B1 | | 10/2008 | McEwen et al. |
| 8,027,117 B1 | | 9/2011 | Sutardja et al. |
| 8,139,301 B1 | | 3/2012 | Li et al. |
| 8,160,181 B1 | | 4/2012 | Song et al. |
| 8,296,637 B1 | | 10/2012 | Varnica et al. |
| 8,543,894 B1 | | 9/2013 | Varnica et al. |
| 8,887,033 B1 | | 11/2014 | Varnica et al. |
| 8,953,276 B1 | | 2/2015 | Pokharel et al. |
| 9,019,642 B1 | | 4/2015 | Xia et al. |
| 9,099,132 B1 | | 8/2015 | Grundvig et al. |
| 9,189,315 B1 | | 11/2015 | Varnica et al. |
| 9,245,578 B1 | | 1/2016 | Wang et al. |
| 9,246,668 B1 | | 1/2016 | Yu et al. |
| 9,311,959 B1 | | 4/2016 | Fan et al. |
| 9,385,757 B1 | | 7/2016 | Nangare |
| 9,489,976 B2 | | 11/2016 | Jury et al. |
| 9,536,563 B1 | | 1/2017 | Liu et al. |
| 9,645,763 B2 | | 5/2017 | Sankaranarayanan et al. |
| 9,998,136 B1 | | 6/2018 | Wu |
| 10,014,026 B1 | | 7/2018 | Wu et al. |
| 10,164,760 B1 | | 12/2018 | Bellorado et al. |
| 10,177,771 B1 | | 1/2019 | Bellorado et al. |
| 10,180,868 B2 | | 1/2019 | Alhussien et al. |
| 10,276,233 B1 | | 4/2019 | Danjean et al. |
| 10,297,281 B1 | | 5/2019 | Bellorado et al. |
| 10,469,290 B1 | | 11/2019 | Marrow et al. |
| 10,498,565 B1 | | 12/2019 | Azenkot et al. |
| 2002/0080898 A1 | | 6/2002 | Agazzi et al. |
| 2003/0185114 A1 | | 10/2003 | Liaw |
| 2003/0198152 A1 | | 10/2003 | Morishima |
| 2004/0101068 A1 | | 5/2004 | Wang et al. |
| 2004/0151268 A1 | * | 8/2004 | Hidaka ............ H04L 25/03038 |
| | | | 375/355 |
| 2004/0153898 A1 | * | 8/2004 | Hidaka ............... H04L 25/0305 |
| | | | 714/708 |
| 2005/0270687 A1 | | 12/2005 | Zweighaft |
| 2006/0215290 A1 | | 9/2006 | Kurtas et al. |
| 2008/0007855 A1 | | 1/2008 | Vityaev et al. |
| 2009/0028252 A1 | | 1/2009 | Lu |
| 2009/0097606 A1 | | 4/2009 | Hutchins et al. |
| 2009/0262870 A1 | | 10/2009 | Ashbrook et al. |
| 2011/0072335 A1 | | 3/2011 | Liu et al. |
| 2012/0082018 A1 | | 4/2012 | Gushima et al. |
| 2013/0201838 A1 | | 8/2013 | Homchaudhuri et al. |
| 2014/0009192 A1 | | 1/2014 | Suzuki |
| 2014/0035638 A1 | | 2/2014 | Bode |
| 2014/0223114 A1 | | 8/2014 | Wang et al. |
| 2015/0022916 A1 | | 1/2015 | Zou et al. |
| 2015/0355838 A1 | | 12/2015 | Chen et al. |
| 2015/0380048 A1 | | 12/2015 | Oberg et al. |
| 2016/0019921 A1 | | 1/2016 | Bui et al. |
| 2016/0293205 A1 | | 10/2016 | Jury et al. |
| 2016/0351227 A1 | | 12/2016 | Koshino |
| 2017/0125089 A1 | | 5/2017 | Sankaranarayanan et al. |
| 2017/0125110 A1 | | 5/2017 | Sankaranarayanan et al. |
| 2017/0236592 A1 | | 8/2017 | Alhussien et al. |
| 2017/0249206 A1 | | 8/2017 | Jeong et al. |
| 2018/0011753 A1 | | 1/2018 | Alhussien et al. |
| 2018/0012663 A1 | | 1/2018 | Alhussien et al. |
| 2018/0277158 A1 | | 9/2018 | Kishino |
| 2018/0367164 A1 | | 12/2018 | Marrow et al. |
| 2019/0130967 A1 | | 5/2019 | Danjean et al. |

OTHER PUBLICATIONS

Hicks, James, "Overloaded Array Processing with Spatially Reduced Search Joint Detection", Virginia Polytechnic Institute & State University, May 10, 2000, pp. 1-144.

Mohammad, Maruf, "Blind Acquisition of Short Burst with Per-Survivor Processing (PSP)", Virginia Polytechnic Institute & State University, Nov. 26, 2002, pp. 1-127.

Nechaev, Y. B., et al., "Increasing Efficiency of Information Transmission with Interference Influence by the Use of Multi-Parameter

(56) References Cited

OTHER PUBLICATIONS

Adaptation", East-West Design & Test Symposium (EWDTS 2013), Rostov-on-Don, 2013, pp. 1-4 (Year: 2013).

* cited by examiner

US 11,361,788 B2

DATA PATH DYNAMIC RANGE OPTIMIZATION

CROSS-REFERENCE TO RELATED APPLICATION

The present application is a continuation of and claims priority to pending U.S. patent application Ser. No. 15/729,139, filed Oct. 10, 2017, entitled "Data Path Dynamic Range Optimization", as well as to U.S. provisional patent application No. 62/522,248, filed Jun. 20, 2017, entitled "MISO Systems and Methods", the contents of which are hereby incorporated by reference in their entirety.

SUMMARY

In certain embodiments, an apparatus may comprise a circuit including a first filter to digitally filter and output a first signal, a second filter to digitally filter and output a second signal, a summing node, and a first adaptation circuit. The summing node may include a first input to receive the first signal from the first filter, a second input to receive the second signal from the second filter, and a summing node output, with the summing node configured to combine the first signal and the second signal to generate a combined signal at the summing node output. The first adaptation circuit may be configured to receive the combined signal, and filter the first signal and the second signal to set a dynamic amplitude range of the combined signal at the summing node output by modifying a first coefficient of the first filter and a second coefficient of the second filter based on the combined signal.

In certain embodiments, an apparatus may comprise a data channel circuit including a first analog front end (AFE) configured to process a first signal, a first analog to digital converter (ADC) configured to receive the first signal from the first AFE and to digitize the first signal, and a first adaptation circuit configured to adapt the dynamic amplitude range of the first signal at the first ADC by adjusting a signal gain at the first AFE based on the first signal output from the first ADC.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
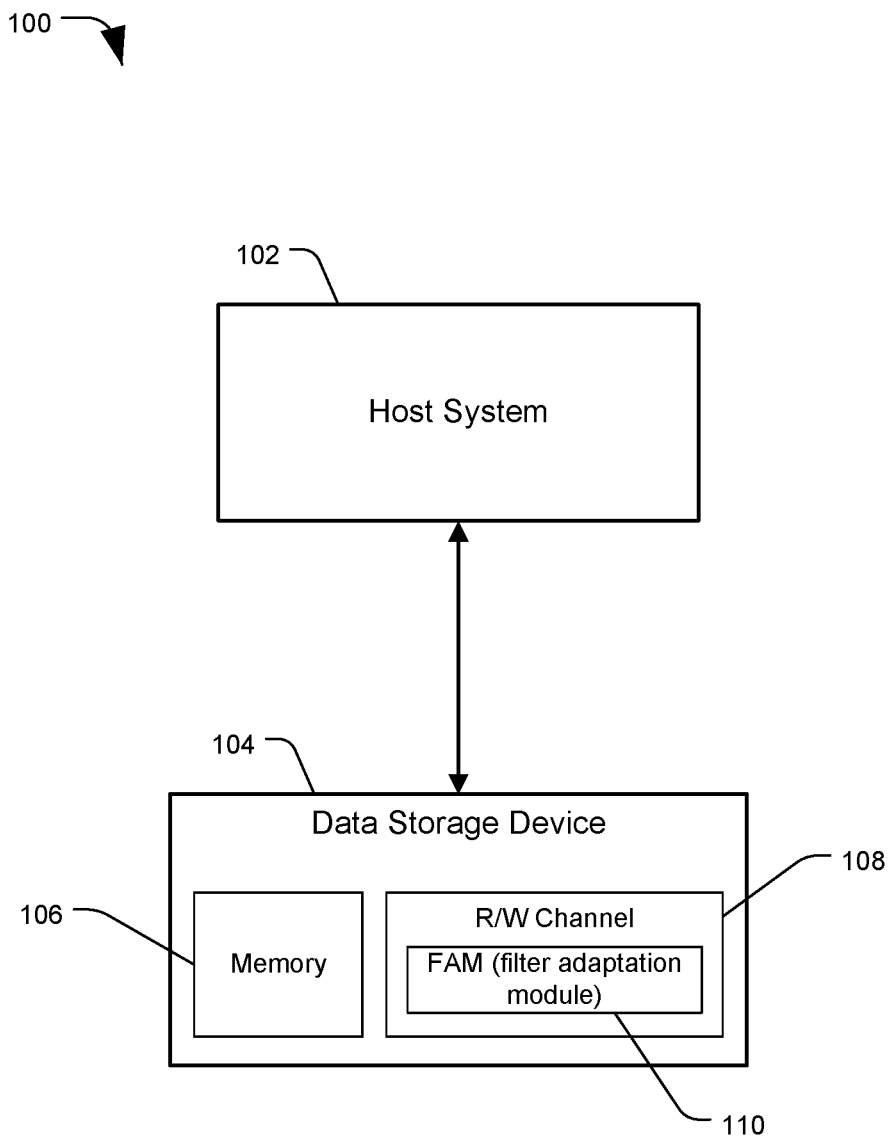
FIG. 1 is a diagram of a system configured for data path dynamic range optimization, in accordance with certain embodiments of the present disclosure.

FIG. 1 is a diagram of a system configured for data path dynamic range optimization, generally designated 100, in accordance with certain embodiments of the present disclosure. The system 100 may include a host 102 and a data storage device (DSD) 104. The host 102 may also be referred to as the host system or host computer. The host 102 can be a desktop computer, a laptop computer, a server, a tablet computer, a telephone, a music player, another electronic device, or any combination thereof. Similarly, the DSD 104 may be any of the above-listed devices, or any other device which may be used to store or retrieve data, such as a hard disc drive (HDD). The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing), or the host 102 and DSD 104 may both be part of a single unit (e.g. a computer having an internal hard drive).

The DSD 104 may include a memory 106 and a read/write (R/W) channel 108. The memory 106 may include a non-volatile data storage medium, such as solid state flash memory, a magnetic storage medium such as a hard disc, other nonvolatile storage mediums, or any combination thereof. The R/W channel 108 may comprise one or more circuits or processors configured to process signals for recording to or reading from the memory 106. During operation, the DSD 104 may receive a data access request, such as a read or write request, from the host device 102. In response, the DSD 104 may perform data access operations on the memory 106 via the R/W channel 108 based on the request.

The DSD 104 may retrieve data from the memory 106 as one or more analog signals, e.g. using one or more receivers, such as reader elements or heads, to detect magnetic signals from tracks of a disc. In an example embodiment, the DSD 104 may be a multi-sensor magnetic recording (MSMR) system, which may use multiple reader elements over a single storage media surface to sense the magnetic field from the same track of the media simultaneously during a read operation. The R/W channel 108 may perform processing on the analog signal(s) to detect a digital bit sequence representing stored data. In an MSMR system, the signals detected from different heads can be combined in the R/W channel 108 to achieve a better performance of recovering the recorded signal (e.g. resulting in a lower bit error rate (BER)) than using a single head.

The data path of the R/W channel 108 may have a dynamic amplitude range, such that the amplitude of a signal at the output of various components can be modified by adjusting settings of those components. Various components of the R/W channel 108 may have an optimum amplitude range at their inputs for the signal(s) being processed. As such, a conditioning process applied by the R/W channel 108 to the signal(s) must appropriately set the signal amplitude to avoid excessive quantization, as would be the case if the signal amplitude were too small, and to avoid excessing saturation, as would be the case if the amplitude were too large. By appropriately setting the signal amplitude at various points along the R/W channel 108, the degradation caused by quantization and saturation may be avoided.

Accordingly, DSD 104 may include one or more filter adaptation modules (FAMs) 110, located within the R/W channel 108. The FAM 110 may perform the methods and processes described herein to adjust signal amplitude within the R/W channel 108 in order to fully use the data path's dynamic range and maintain peak signal quality and channel performance. In this manner, the functioning of the DSD 104 may be improved by increasing the R/W channel's ability to accurately determine a bit pattern from a detected analog signal. An example arrangement of some elements from a R/W channel is depicted in regard to FIG. 2.

Figure 2:
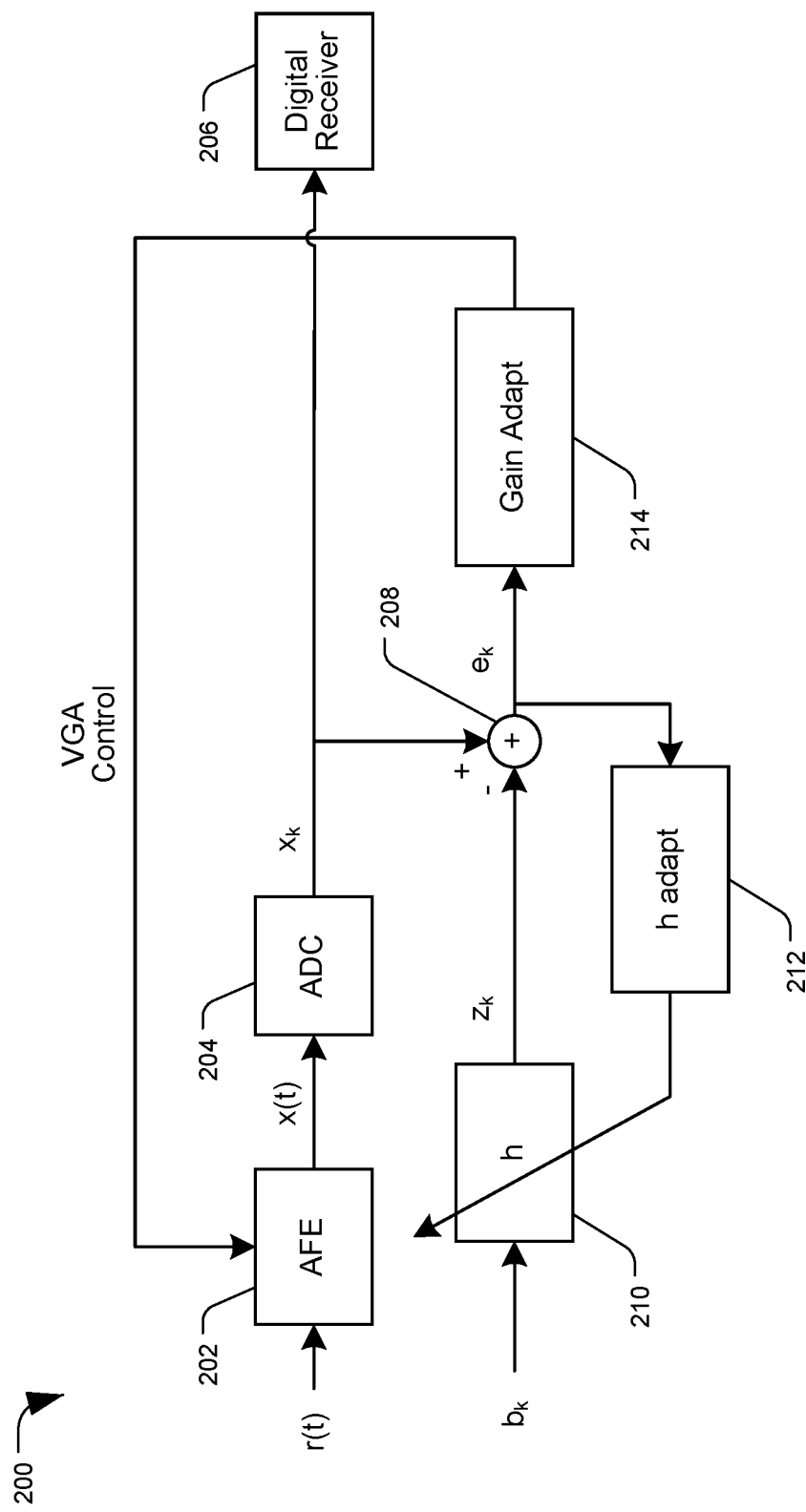
FIG. 2 is a diagram of a system configured for data path dynamic range optimization, in accordance with certain embodiments of the present disclosure.

FIG. 2 is a diagram of a portion of a system configured for data path dynamic range optimization, generally designated 200, in accordance with certain embodiments of the present disclosure. The system 200 may include components from a data channel, such as the R/W channel 108 of FIG. 1.

In the depicted example, a signal r(t) may be received at a channel for processing, such as from a read head of a storage device. The signal r(t) may undergo continuous-time signal processing at an analog front-end (AFE) circuit 202, outputting the processed analog signal x(t). The processed signal x(t) may be converted to a digitized sample sequence $x_k$ by an analog-to-digital converter (ADC) circuit 204. The digital sample sequence $x_k$ may be sent down the channel to a digital receiver 206, which may determine a sequence of data bits based on the samples. As a note on the signals discussed herein, a waveform, in general, may be continuous-time (e.g. often denoted by x(t) or the like for a signal value at a given time "t") or discrete time (e.g. often denoted by $x_k$ or x(k) for a signal value of a given sample "k"). Either may be referred to as a signal or a "waveform", but the discrete time signal can also be referred to as a sample sequence.

The ADC 204 may have a fixed amplitude range that it accepts at its input. For example, the ADC 204 may have a 200 millivolt (mV) input amplitude range, peak-to-peak, from a minimum value of –100 mV to a maximum value of 100 mV. The input range that a component accepts may be referred to as its dynamic range. The signal x(t) may therefore have an optimum amplitude range to fully utilize the dynamic range of the ADC 204. Quantization may occur if the amplitude range of x(t) was 100 mV, which would only use half the ADC's range, or 50 millivolts, which would only use a quarter of the ADC's range. Conversely, saturation may occur if the amplitude range of x(t) was 300 mV, which may result portions of the signal being "clipped off" (e.g. the tops or bottoms of the signal waveform may be lost). The ADC 204 my directly map values of x(t) within its input range to the output range of $x_k$, so that properly setting the range of x(t) at the AFE 202 may set the range of $x_k$.

As an example, the ADC 204 may be a 6-bit ADC with a 200 mV input range. The ADC 204 may map an input voltage to a digitized value. The 6-bit ADC 204 may map voltages to digital values from, e.g. –31 to +31, with the 200 mV range being divided up approximately so that an input voltage from:

–100 mV to –96.875 mV maps to –31

. . .

–6.25 mV to –3.125 mV maps to –1

–3.125 mV to 3.125 mV maps to 0

3.125 mV to 6.25 mV maps to 1

96.875 mV to 100 mV maps to 31.

The ADC 204 may act as a pass-through element that converts millivolts into a number of least significant bits (LSBs) or a value range. So after passing through the ADC 204, the range of the signal x(k) may be –31 to +31, which, excluding quantization and saturation, may be synonymous with the input millivolt range, and may be the same range expressed in different units. If the range of the signal x(t) is set to less than the full input range of the ADC 204, it may be suboptimal since some values will never appear and granularity may be lost. If the range of the signal is set higher than the input range of the ADC 204, then any voltage values greater than, e.g. 96.875 mV may be categorized into digital value 31, even if the voltage was as high as, e.g. 300 mV, effectively "clipping off" a large portion of the signal. In general, applying a signal slightly in excess of the ADC 204 input range (e.g. –110 mV to 110 mV) may be optimal since it would provide some extra resolution around 0 mV, which can be an important range, and because having good resolution for large input voltages may not be as important. Therefore, the optimum amplitude range of the signal may be a value that would be most effective for the purposes of the receiving component based on that component's input range. Fully utilizing the input range of a component of the data path may include setting the amplitude of the signal to approximately match the input range of the component, or may include setting the signal amplitude slightly lower or higher than the input range of the component, in some example embodiments.

Therefore, the conditioning process at the AFE 202 can set the amplitude range of x(t) so as to fully utilize the ADC 204 dynamic range and avoid degradation of the signal and the channel's performance. To accomplish the appropriate amplitude scaling, a variable gain amplifier (VGA) control signal may be applied to the AFE 202, which may provide the AFE with a multiplier with which to scale the signal r(t) up for a larger amplitude, or down for a smaller amplitude of x(t).

Although the VGA control value may be selected in a number of ways, an example method is described in regard to FIG. 2. The VGA control value may be generated by a gain adaptation circuit or module 214, based on an error signal $e_k$. The error signal $e_k$ may be generated at a summing node, junction, or circuit 208 based on a difference between the sample sequence $x_k$ and an expected (e.g. noiseless) waveform $z_k$ from a channel pulse response estimate or filter "h" 210. As used herein, filters may be modules that perform signal processing functions (e.g. "filtering") to reduce or enhance elements of a signal, such as adjusting the signal's amplitude range. The filters may include coefficients applied in mathematical operations to filter the signal, and adjusting the coefficients can be used to adjust properties of the filtered signal. The filter h 210 may generate the expected waveform $z_k$ based on an underlying or expected bit sequence $b_k$. The bit sequence $b_k$ may come from a variety of sources, such as a detector of the data channel, or a known bit sequence if known data is written to the storage media being read.

As stated, the error signal $e_k$ may be provided to the gain adaptation circuit 214, and may also be provided to an h adaptation module or circuit 212, which may adapt the parameters or coefficients of h 210 based on the error signal $e_k$. The adaptation of the system 200 may be considered joint between h 210 and the VGA control in that they interact through and are both adapted based on the error generation of $e_k$. Accordingly, the adaptation via gain adapt 214 and h adapt 212 may operate to select the dynamic range of the noiseless signal $z_k$ and of the sampled data sequence $x_k$. If $x_k$ and $z_k$ are not fully matched, the resulting error values $e_k$ be excessively large and, thus, the system may adapt to make $x_k$ and $z_k$ match by increasing the gain via the VGA control or decreasing the coefficients at h 210.

An example implementation of generating the error signal $e_k$ may be expressed as:

$$e_k = x_k - z_k$$
$$= x_k - \sum_{i=-L}^{L} h_k^i \times b_{k-i}, \quad (1)$$

where $x_k$ may be a linear function of the VGA gain (e.g. $x_k \approx g_k \times r(kT)$, where $g_k$ may be the VGA gain applied by the AFE 202 based on the VGA control signal, and r(kT) may be the sampled input waveform). If minimization of the expected squared error is desired, a least-mean square (LMS) adaptation procedure may be utilized. Here the gradients can be generated as the derivative of the squared error with respect to the VGA control gain and the pulse response filter h 210 coefficients as, $$\nabla_{g_k} = e_k \times r(kT)$$
$$\nabla_{h_k}^i = -e_k \times b_{k-i}. \quad (2)$$

In the top equation in (2), as r(t) is never sampled, the value of r(kT) may not be known. The lack of knowledge of the sampled input waveform r(kT) can be addressed by approximating it using the corresponding ADC 204 sample ($x_k$), which may be acceptable to within a scale factor for a static VGA gain. This is because the continuous-time signal r(t) may be scaled by the VGA gain $g_k$ at the AFE 202 (e.g. x(t)=$g_k$*r(t)), and sampled by the ADC 204 at time kT (e.g. $x_k$=x(kT)). Substituting these values provides $x_k$=x(kT)= $g_k$*r(kT). These gradients can be generated and utilized to update each parameter as, $$g_{k+1} = g_k + \mu \times \nabla_{g_k},$$
$$h_{k+1}^i = h_k^i + \mu \times \nabla_{h_k^i} \quad (3)$$

where μ is the adaptation step-size. The gain gradient may be generated by the gain adapt module 214 and used to adapt the VGA control sent to the AFE 202 to adapt $x_k$, and the h gradient may be generated by the h adapt module 212 and used to adapt the h filter 210 to adapt $z_k$.

When the described joint adaptation of filter h 210 and VGA control is implemented, it should be done in a manner that avoids the degenerate solution in which all parameters converge to zero. By setting the VGA gain at the AFE 202 to zero and all coefficients of h 210 to zero, the resulting error $e_k$ will also be zero, which may not be particularly useful and, thus, should be avoided. Avoiding this solution may be done in different ways; however, the examples provided herein may focus on any method which constrains the pulse response estimate h 210 so as to fix the dynamic range of $z_k$. For example, one method to accomplish this may be by adapting a single or selected coefficient of the pulse response filter h 210 so as to fix the absolute sum of the coefficients of h 210 to a selected constant value (K). Since the bits $b_k$ applied to the h filter 210 may be in {−1, +1}, this absolute sum of the coefficients may represent the largest potential positive and negative values generated by this convolution and, thus, may set the dynamic range of $z_k$. For example, if the absolute sum of the coefficients K is set to 6, the largest potential positive value of $z_k$ may be +6, while the largest potential negative value may be −6. In general, the maximum positive value of $z_k$ may be obtained when the sign of the bits $b_k$ is equal to the sign of the coefficients of h 210, and the maximum negative value when they are not equal.

Since the joint adaptation acts to minimize the error sequence $e_k$ (e.g. the expected squared error between $z_k$ and $x_k$), the gain adapt 214 and the pulse response filter h 210 may jointly adapt to match $x_k$ to $z_k$ and, thus, also (approximately) sets the dynamic range of $x_k$ to K. In this way, K may be selected to ensure that the entire dynamic range of the ADC 204 is fully utilized. Although the selection of the absolute sum K of the coefficients of h 201 was provided as an example, any such method which allows for a selection of the dynamic range of the digitized sequence $x_k$ may also be considered in the context of this disclosure.

The foregoing examples provided methods for scaling a signal being applied to an ADC 204 using the joint adaptation of a pulse response filter h 210 and a VGA control value via a gain adapt module 214, in order to select the dynamic range of the output of the ADC 202. Although this concept may be important to ensure that performance is not lost through ADC 204 sampling, signal scaling throughout the remainder of the data-path can also be controlled for similar reasons. For example, depending on the application, data-paths for digital receivers may be quite complex, consisting of numerous filters, used both in cascade and in parallel operation, as well as other forms of processing and signal combining. In addition, the number of bits utilized at each point in the data-path may be generally constrained and may vary from block to block. Ensuring a fully utilized data-path, therefore, may not be a straightforward procedure. The application of joint adaptation to constrain dynamic ranges of signals throughout a data-path is addressed in further detail in regard to FIG. 3.

Figure 3:
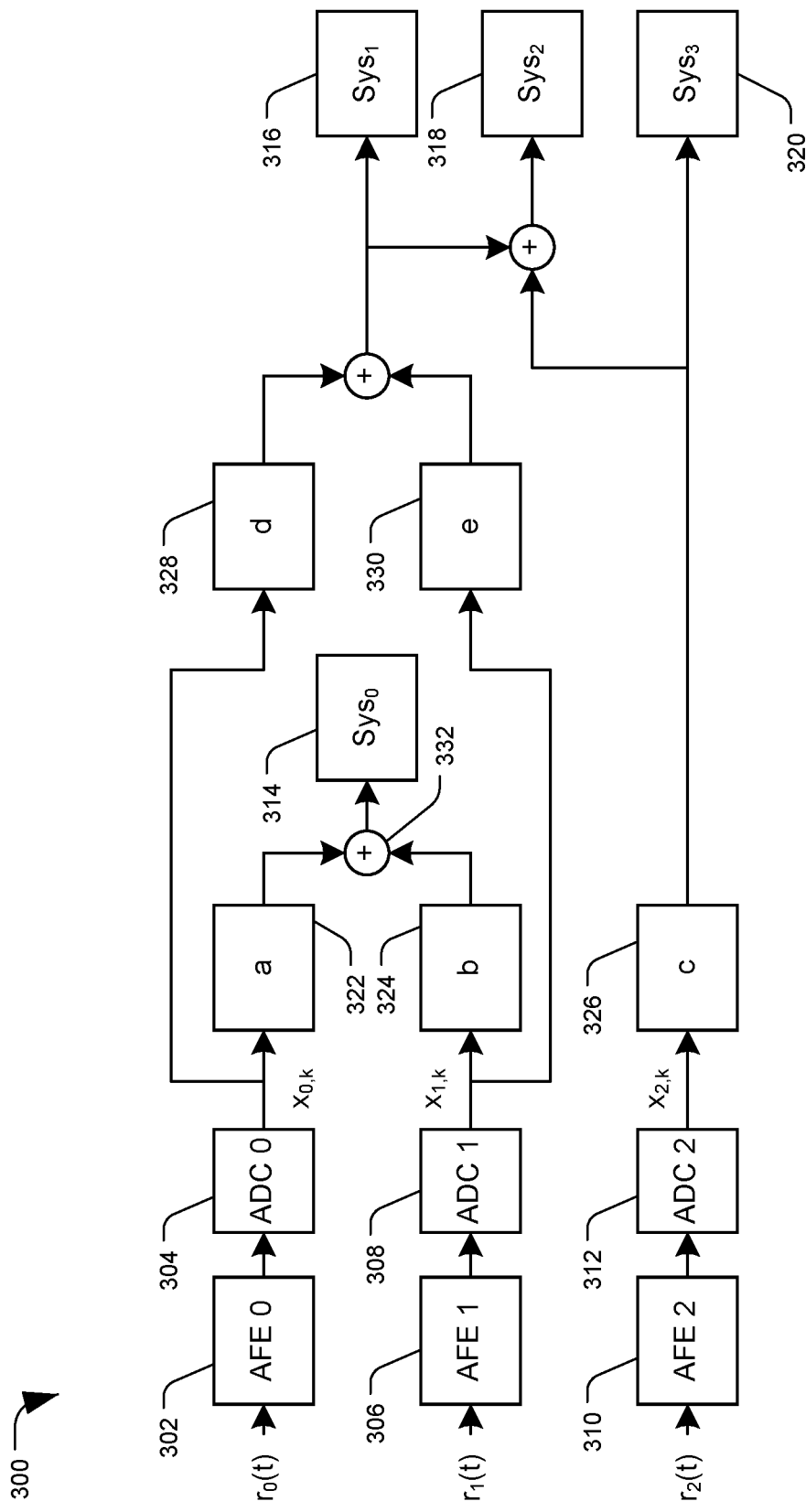
FIG. 3 is a diagram of a system configured for data path dynamic range optimization, in accordance with certain embodiments of the present disclosure.

FIG. 3 is a diagram of a system configured for data path dynamic range optimization, generally designated 300, in accordance with certain embodiments of the present disclosure. The system 300 may include components from a data channel, such as the R/W channel 108 of FIG. 1.

A simple complexity data-path may include a single ADC and digital filter followed by a detector, and therefore utilizing the full dynamic range of an ADC output and digital filter output may be accomplished with, e.g. adding a single constraint, such as the joint adaptation h filter with absolute sum coefficient K as discussed in regard to FIG. 2. For more complex data-paths, such as those which may arise, for example, in multi-antenna wireless systems or in hard-disk drives employing multi-sensor read heads (a technology referred to as Multi-Sensor Magnetic Recording (MSMR)), fully utilizing the dynamic range of the data-path may be non-trivial. In such systems, multiple signals may be received, each of which may be processed, sampled, and (potentially) combined in a digital receiver. System 300 may be an example of such a multiple receiver complex data channel.

In system 300, three continuous-time signals $r_0(t)$, $r_1(t)$, and $r_2(t)$, may be received and processed at respective AFE 0 302 and ADC 0 304, AFE 1 306 and ADC 1 308, and AFE 2 310 and ADC 2 312. The three signals may be sampled to generate digital sample sequences $x_{0,k}$, $x_{1,k}$, and $x_{2,k}$, respectively. These digitized sequences may then be processed by a number of digital filtering operations or circuits, such as filter a 322, filter b 324, filter c 326, filter d 328, and filter e 330, to produce linear transforms of the digital sample sequences. The filters may be configured to adjust or adapt an amplitude of a sample sequence processed by the filters. The outputs of the filters a through e may then be combined at various locations along the data-path and applied as inputs to four digital subsystems $Sys_0$ 314, $Sys_1$ 316, $Sys_2$ 318, and $Sys_3$ 320. For example, the outputs of filters a 322 and b 324 may be combined at summing node 332 to generate a combined signal at the summing node output, which combined signal may be provided to $Sys_0$ 314.

As shown, $Sys_0$ 314 and $Sys_1$ 316 may receive linear transforms of $x_{0,k}$ and $x_{1,k}$, $Sys_2$ 318 may receive a linear transform of $x_{0,k}$, $x_{1,k}$, and $x_{2,k}$, and $Sys_3$ 320 may receive a linear transform of $x_{2,k}$. The systems $Sys_0$ 314, $Sys_1$ 316, $Sys_2$ 318, and $Sys_3$ 320 may include complex signal processing operations or circuits (e.g. differentiated from simple operations such as filters or multipliers, combination logic, delay lines, etc). Sys elements may include detection algorithms, decoding algorithms, acquisition logic, any other type of complex signal processing operations, or any combination thereof. To avoid degradation of these Sys processes, a methodology is proposed to maximally utilize the dynamic range at important points throughout the system 300. As discussed herein, a signal's dynamic range may be constrained, or "pinned", at any specific point in the data-path using a joint adaptation between a pulse response filter (e.g. filter h 210 of FIG. 2) and another filter used to impose the constraint (e.g. the AFE 202 of FIG. 2, with a note that a gain, such as that provided by the VGA of the AFE, may be a single tap filter). While constraining all points throughout the data path 300 may be an option to maximally utilize the data path's dynamic range, this may degrade system performance, and better results may be achieved by selecting appropriate points along a complex data-path at which to apply constraints. In some cases, the proposed methodology may include the addition of digital filters to the data-path 300 to impose the constraints. An example embodiment of applying constraints to multiple parallel filters is depicted in FIG. 4.

Figure 4:
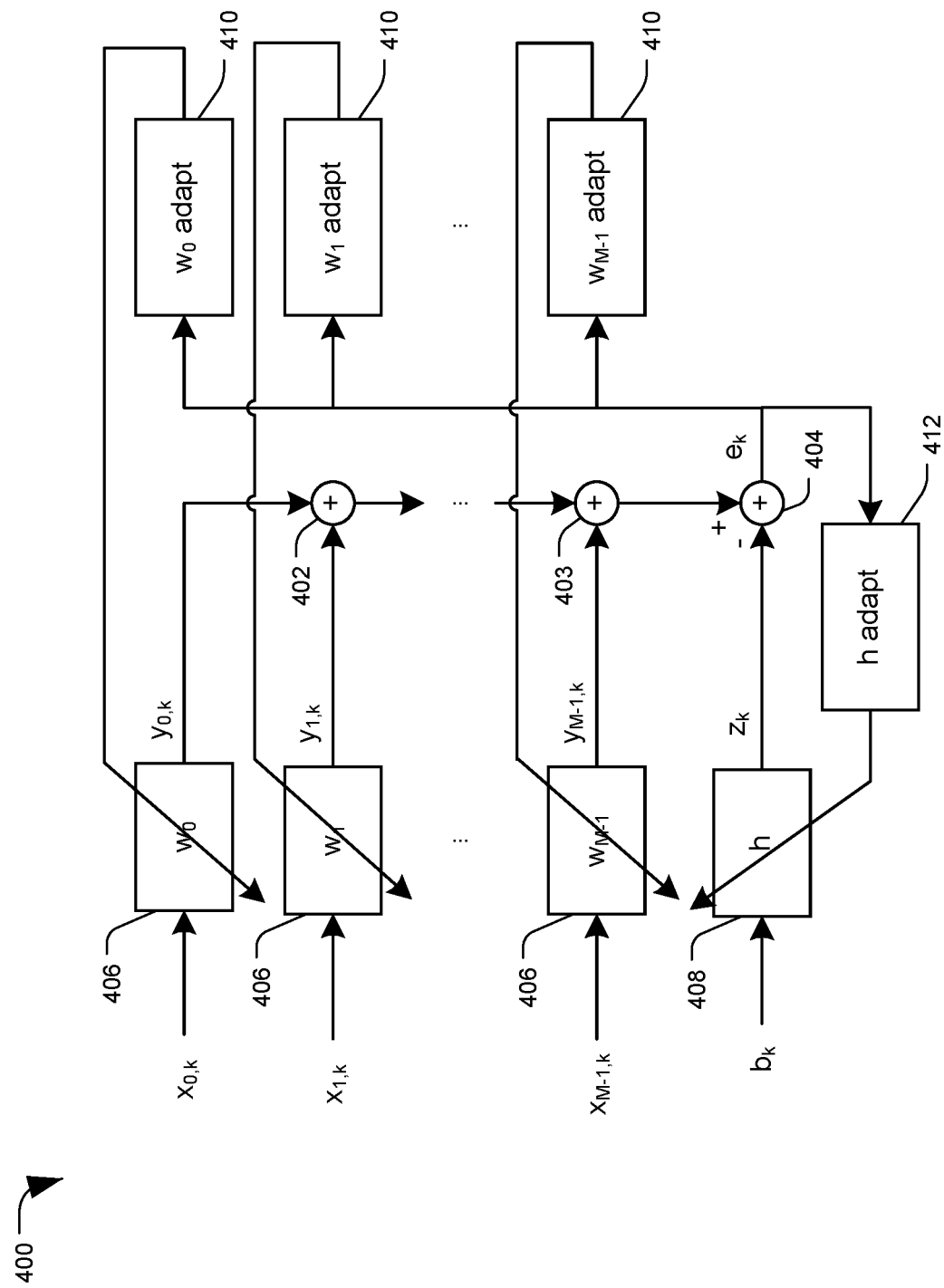
FIG. 4 is a diagram of a system configured for data path dynamic range optimization, in accordance with certain embodiments of the present disclosure.

FIG. 4 is a diagram of a system configured for data path dynamic range optimization, generally designated 400, in accordance with certain embodiments of the present disclosure. The system 400 may include components from a data channel, such as the R/W channel 108 of FIG. 1 or system 300 of FIG. 3.

System 400 shows an example in which the concepts of pinning a signal's dynamic range as described in regard to FIG. 2 is extended to include M parallel filters 406 ($w_0$, $w_1$, ..., $w_{M-1}$), the outputs of which may be summed at a series of summing nodes 402, with a final summing node 403 outputting the sum of all M $w_i$ filter outputs. An error signal $e_k$ may be generated based on the combined outputs of the M filters 406 and the output of a pulse response filter h 408 at an error signal generating summing node 404. The error signal $e_k$ may be used to jointly adapt the M parallel filters 406 via corresponding adapt modules 410, as well as the pulse response filter h 408 via the h adapt module 412.

The error generation may be expressed in terms of the M sequences of samples ($x_{0,k}$, $x_{1,k}$, ..., $x_{M-1,k}$), the bit sequence ($b_k$), and the coefficients of all filters 406 and 408 ($w_0$, $w_1$, ..., $w_{M-1}$, h) as:

$$e_k = \sum_{m=0}^{M-1} y_{m,k} - z_k \qquad (6)$$
$$= \sum_{m=0}^{M-1} \sum_{i=-N}^{N} w_k^{m,i} \times x_{k-i} - \sum_{i=-L}^{L} h_k^i \times b_{k-i},$$

yielding the gradients, $$\nabla_{w_k^{0,i}} = e_k \times x_{0,k-i} \qquad (7)$$

$$\nabla_{w_k^{1,i}} = e_k \times x_{1,k-i}$$

$$\vdots \qquad \vdots \qquad \vdots$$

$$\nabla_{w_k^{M-1,i}} = e_k \times x_{M-1,k-i}$$

$$\nabla_{h_k^i} = -e_k \times b_{k-i}.$$

Because the error generation can be conducted on the sum of the M filter 406 outputs, the joint adaptation here can act to pin the output of the final summing junction 403 to a given dynamic range, whereas the output of each of the M filters 406 may be completely unconstrained. This can be useful to the proposed methodology, as it allows the filters 406 to individually weight each signal path as the squared error dictates. For example, for the case of M=2, if signal $x_{0,k}$ is extremely noisy relative to $x_{1,k}$ then filters $w_0$ and $w_1$ can act to weight their relative contributions to the sum accordingly (e.g. weight down the contribution of $x_{0,k}$ to the sum relative to that of $x_{1,k}$). The ability of each of the parallel filters 406 to independently adjust its weight coefficients can be beneficial when signals and corresponding sample sequences ($x_{0,k}$, $x_{1,k}$, ..., $x_{M-1,k}$) exhibit transient behavior in which the individual contribution to square error may be changing over time and should be correspondingly tracked by filters 406 $w_0$, $w_1$, ..., $w_{M-1}$. The concept of constraining the summation of multiple filters while leaving the individual filters independently adaptable may be incorporated into the overall data-path range optimization methodology.

The constraints which can be used to pin a signal to a desired amplitude may be implemented via an adaptation circuit, which may be referred to as a filter adaptation module (FAM), via a process similar that described in regard to FIGS. 2 and 4. An example implementation of a FAM is described in regard to FIG. 5.

Figure 5:
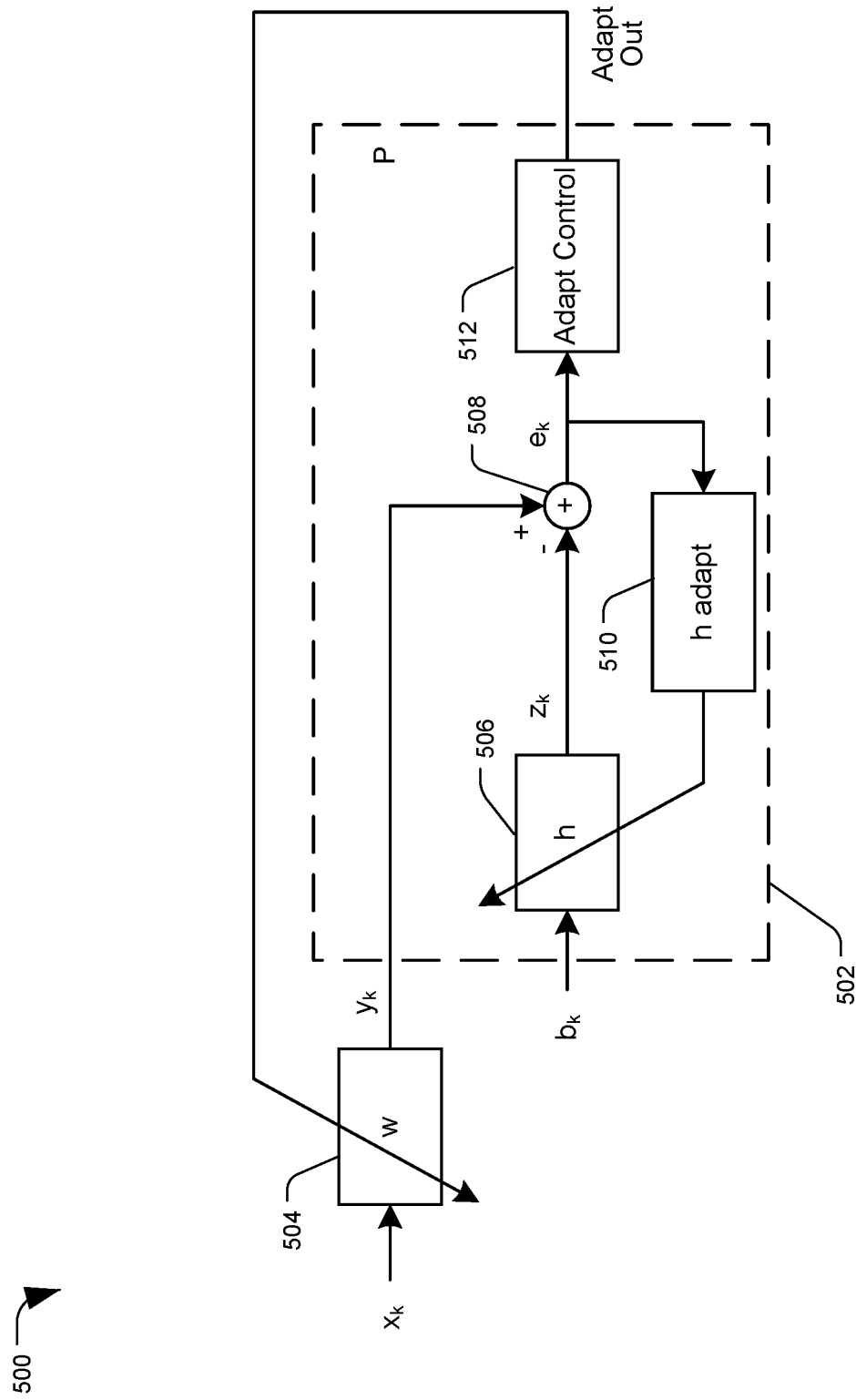
FIG. 5 is a diagram of a system configured for data path dynamic range optimization, in accordance with certain embodiments of the present disclosure.

FIG. 5 is a diagram of a system configured for data path dynamic range optimization, generally designated 500, in accordance with certain embodiments of the present disclosure. In particular, FIG. 5 depicts an example filter adaptation module (FAM) 502, such as the FAM 110 of FIG. 1, which may be incorporated into a data-path to pin a signal to a desired dynamic amplitude range.

The FAM 502, which may also be referred to herein as a P block, may apply joint adaptation techniques as described in regard to FIGS. 2 and 4. As shown, the input to the P block 502 may be a sequence of samples $y_k$ (which may be a linear transform of a sample sequence $x_k$) via a filter w 504, and the output may be an adaptation control applied to filter w 504 to apply a constraint. The P block 502 itself may include a pulse response filter h 506, which may generate a noiseless expected signal $z_k$ based on an estimated or known bit sequence $b_k$. An error signal $e_k$ may be generated at summation node 508 based on $y_k$ and $z_k$. The error signal may be provided to an h adaptation block 510 to adapt the pulse estimation filter h 506, as well as to the adapt control block 512 to generate the adapt out signal used to adapt the w filter 504. In certain embodiments, multiple adapt control blocks 512 may be included if the P block 502 is used to constrain the output from multiple filters w 504, such as was described in regard to FIG. 4.

The overall operation of the P block 502 may be to jointly adapt its contained pulse response filter h 506 along with another block (e.g. filter w 504), as specified by its adapt out control, so as to fix the dynamic range of its applied sample sequence ($y_k$). Example additions of P blocks 502 at various points along a data-path in order to constrain dynamic signal ranges at strategic points, according to the methodology proposed herein, are described in regard to FIGS. 6 through 10.

Figure 6:
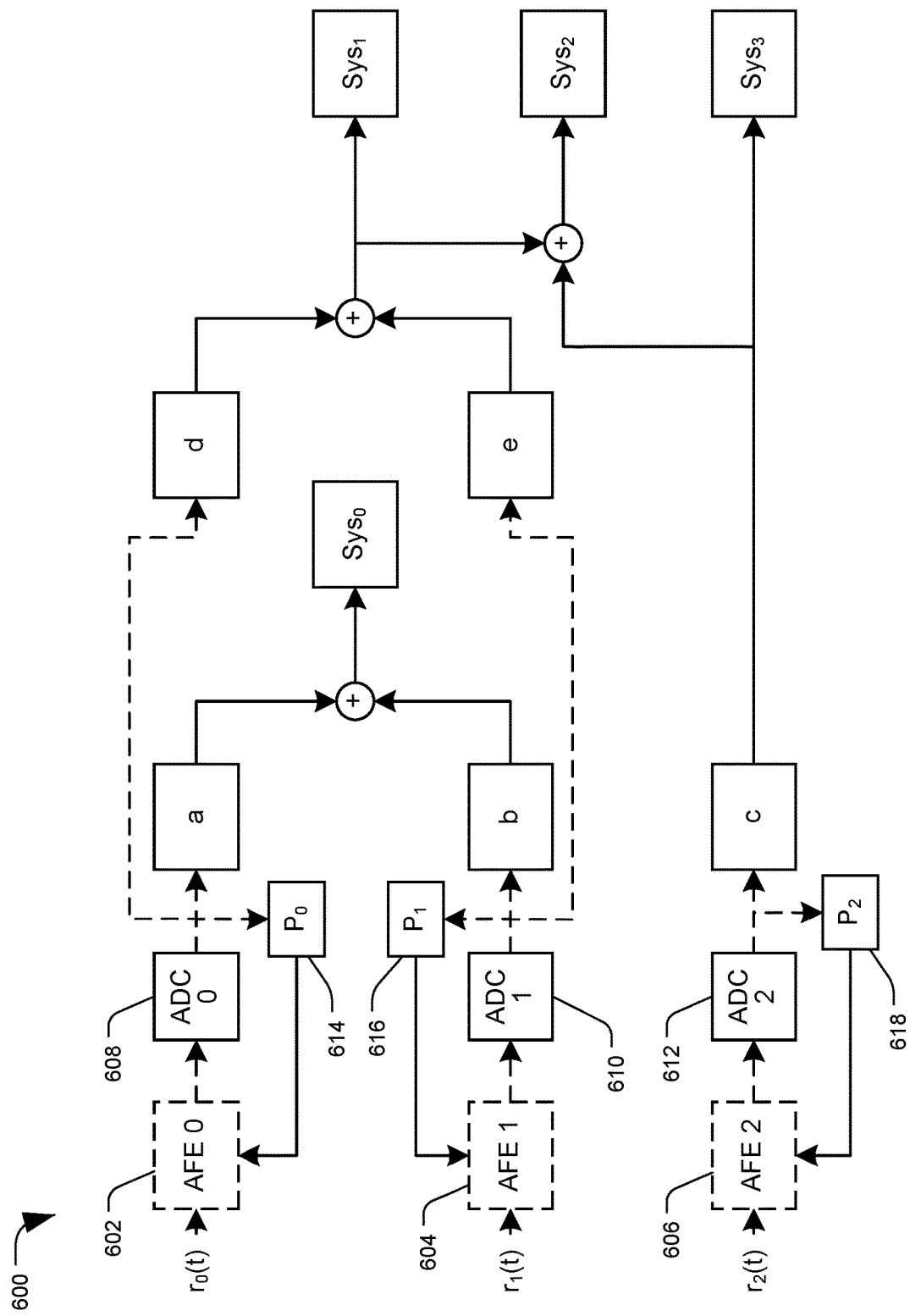
FIG. 6 is a diagram of a system configured for data path dynamic range optimization, in accordance with certain embodiments of the present disclosure.

FIG. 6 is a diagram of a system configured for data path dynamic range optimization, generally designated 600, in accordance with certain embodiments of the present disclosure. The system 600 may include components from a data channel, such as the R/W channel 108 of FIG. 1. In particular, system 600 depicts a system in which FAMs or P blocks are added at various strategic points to a system data path 600 in order to fully utilize a desired dynamic amplitude range for that portion of the data path 600.

An overview the proposed methodology will be provided here. One or more steps from the methodology may be implemented in a data-path to optimize utilization of the data-path's dynamic range at strategic positions, improving the overall performance of the channel. The methodology may be directed to the fact that a signal may be pinned to any desired amplitude at any point to maximally utilize the dynamic range. The methodology may include the following proposals:

1) Add a P block at the output of each ADC with the Adapt Out signal applied to each AFEs respective VGA module.
2) For each summing junction for which the output of two or more filters is applied, add a P block at the summing junction output with the Adapt Out signal applied to all filters preceding the summing junction. These filters are not re-used for additional constraints.
3) For each summing junction for which one or more input does not contain a filter, or that filter is already involved in another constraint, add a filter for each such branch. The result should be that all incoming branches to the summing junction contain filters available for adding constraints such that rule 2) may be applied.
4) For any system that takes the output of a filter not already used in a constraint, add a P block with the Adapt Out signal applied to that filter.
5) For any system that takes a signal that is not constrained, and has no filter available to add a constraint, add a filter such that rule 4) may be applied.

The order of implementing or considering the proposals in the design of a data-path may be arbitrary, and may, e.g. be considered from the ADCs downstream, or from the systems upstream, or in another other order. Some proposals may be implemented while others may be discarded, or additional signal constraints may be added.

The methodology proposed herein may include the addition of constraints to the output of ADCs in the system (e.g. via adjusting gain at the AFEs, as the ADCs may perform direct mapping of voltage inputs to digitized sample value outputs) and to inputs to subsystems that do not already have an imposed constraint. Here, the former of these proposals may be to ensure that no loss is incurred through ADC sampling, and the latter to enforce an expected signal range into each subsystem. In scenarios in which there exist filters to impose such constraints (e.g. based on adapt out signals from P blocks), those filters can be utilized. When no such filters exists, filters may be added to the data-path to impose the constraints. For the filters, a single tap filter may be used (e.g. a multiplier value that may scale the signal amplitude up or down according to the selected multiplier), or longer filters may be used if spectral shaping is desired in addition to the signal scaling. Once a filter is utilized to impose one constraint, it may not be used to impose another, different constraint. In the event that multiple constraints are desired, additional filters and P blocks may be added such that all desired constraints may be imposed. In addition to constraints imposed to ADCs and before subsystems, the methodology may also include constraining the output of every summing junction, or selected summing junctions, as shown and described in regards to FIG. 4. Selectively imposing one or more of the described constraints can significantly improve the overall performance of a system. Applying all of these proposals throughout the data-path may provide superior results to piecemeal implementation.

Turning now to the exemplary embodiment of FIG. 6, a complex data channel 600 is depicted that receives three signals, $r_0(t)$, $r_1(t)$, and $r_2(t)$, at three corresponding AFEs, AFE 0 602, AFE 1 604, and AFE 2 606. The output from the AFEs is provided to three corresponding ADCs, ADC 0 608, ADC 1 610, and ADC 2 612. According to the first proposal of the methodology, for each received signal, constraints are imposed so as to fully utilize the range of the corresponding ADC. This may be accomplished through the addition of FAM P blocks, including $P_0$ 614, $P_1$ 616, and $P_2$ 618. Once a portion of the data path has been pinned, by way of setting coefficients at a filter based on the adaptation output from a P block, the pinned or constrained portions of the data path are depicted in FIG. 6 as dashed lines. Here, a sample sequence is applied to a P block from an ADC, which then applies a constraint to the AFE preceding the ADC, thereby pinning the dynamic range of the sample sequence before and after the ADC. The ADC may not modify the dynamic range of the sample sequence, and so the range may remained pinned even after the sample is processed by the ADC. Furthermore, the block used to enforce this constraint (e.g. the AFEs in this case) are also outlined using dashed lines to indicate that they are now involved in enforcing a constraint and, thus, cannot be used to impose another constraint.

Figure 7:
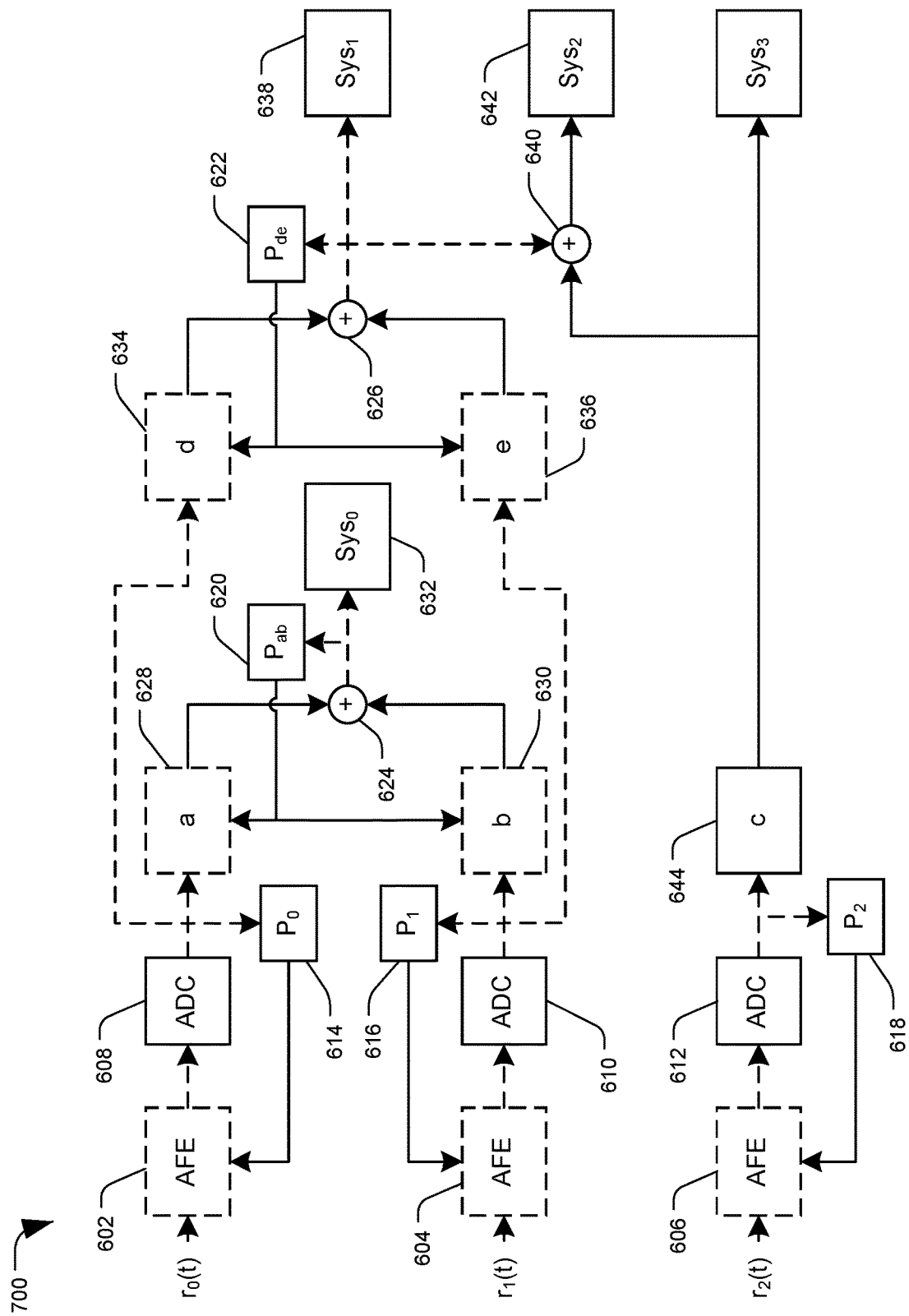
FIG. 7 is a diagram of a system configured for data path dynamic range optimization, in accordance with certain embodiments of the present disclosure.

Turning now to FIG. 7, a diagram of another potential embodiment of a system 700 for data path dynamic range optimization is shown, in accordance with certain embodiments of the present disclosure. The system 700 may be another example of the system 600 of FIG. 6, and accordingly corresponding elements may share the same numbers for simplicity.

In system 700, the proposal 1) has already been applied to constrain the dynamic range of the ADCs. Proposal 2) may be applied next, by adding P blocks, $P_{ab}$ 620 and $P_{de}$ 622 to the output of two summing nodes, summing node 624 and summing node 626, respectively. Summing node 624 can combine the outputs of filter a 628 and filter b 630 to generate the input to system $Sys_0$ 632. Summing node 626 can combine the outputs of filter d 634 and filter e 636 to generate the input to system $Sys_1$ 638. The P block Pa, 620 may jointly adapt filters a 628 and b 630 in order to constrain the output from summing node 624, but may not directly constrain the outputs of either filter. Similarly, the P block $P_{de}$ 622 may adapt filters d 634 and e 636 in order to constrain the output from summing node 626, rather than the outputs of either filter. Not directly constraining the outputs of filters that output to summing junctions may be useful as it may allow the composition of the summing junction outputs to contain an arbitrary portion of each filter output (e.g. the input to $Sys_0$ 632 may contain anywhere from 100% filter a 628 output to 100% filter b 630 output, which would not be possible if the output ranges are fixed in size). Filters a 628, b 630, d 634, and e 636, as well as the outputs of summing nodes 624, 626 are now shown in dashed lines to indicate they have an existing constraint applied, and cannot support additional constraints.

Based on the above, is noted that proposal 2) has not been applied to summing junction 640 which generates the input to $Sys_2$ 642, as one of the inputs to summing node 640 does not have a filter capable of adding a constraint to the summing junction 640 output. For example filter c 644 may be used to constrain one input to summing node 640, but the other input comes from summing node 626, which is already constrained according to a different constraint from P block $P_{de}$ 622. This situation may be addressed as discussed in regard to FIG. 8.

Figure 8:
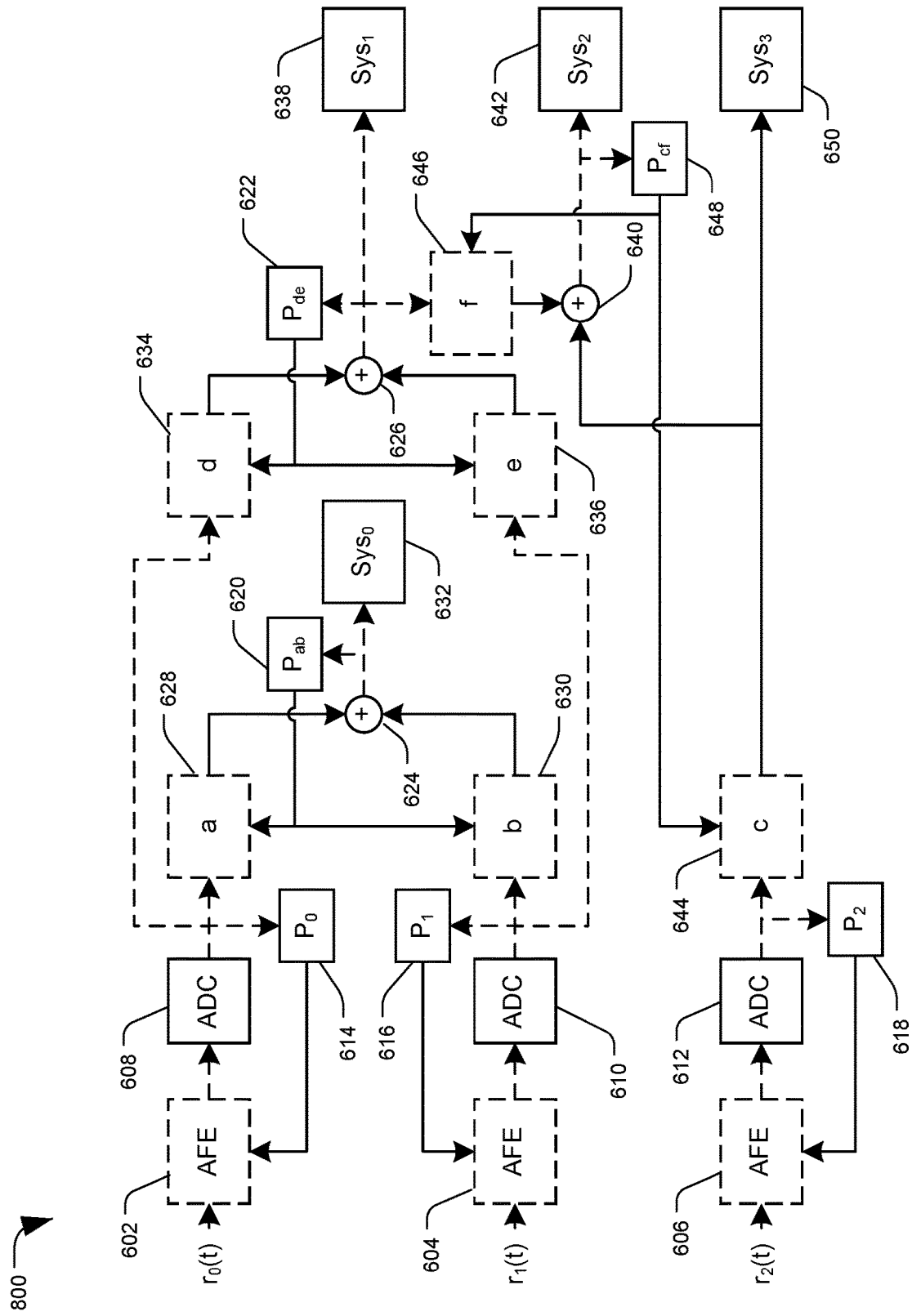
FIG. 8 is a diagram of a system configured for data path dynamic range optimization, in accordance with certain embodiments of the present disclosure.

FIG. 8 is a diagram of a system configured for data path dynamic range optimization, generally designated 800, in accordance with certain embodiments of the present disclosure. The system 800 may be another example of the system 600 of FIG. 6 or the system 700 of FIG. 7, and accordingly corresponding elements may share the same numbers for simplicity.

In order to address the situation that the output of summing node 640 cannot be constrained, proposal 3) may be used to add a filter f 646 between the output of summing node 626 and the input to summing node 640. In this manner, proposal 2) may be used to add P block $P_{cf}$ 648 to jointly constrain filters f 646 and c 644, and thus constrain the output of summing node 640 and the input to $Sys_2$ 642.

Figure 9:
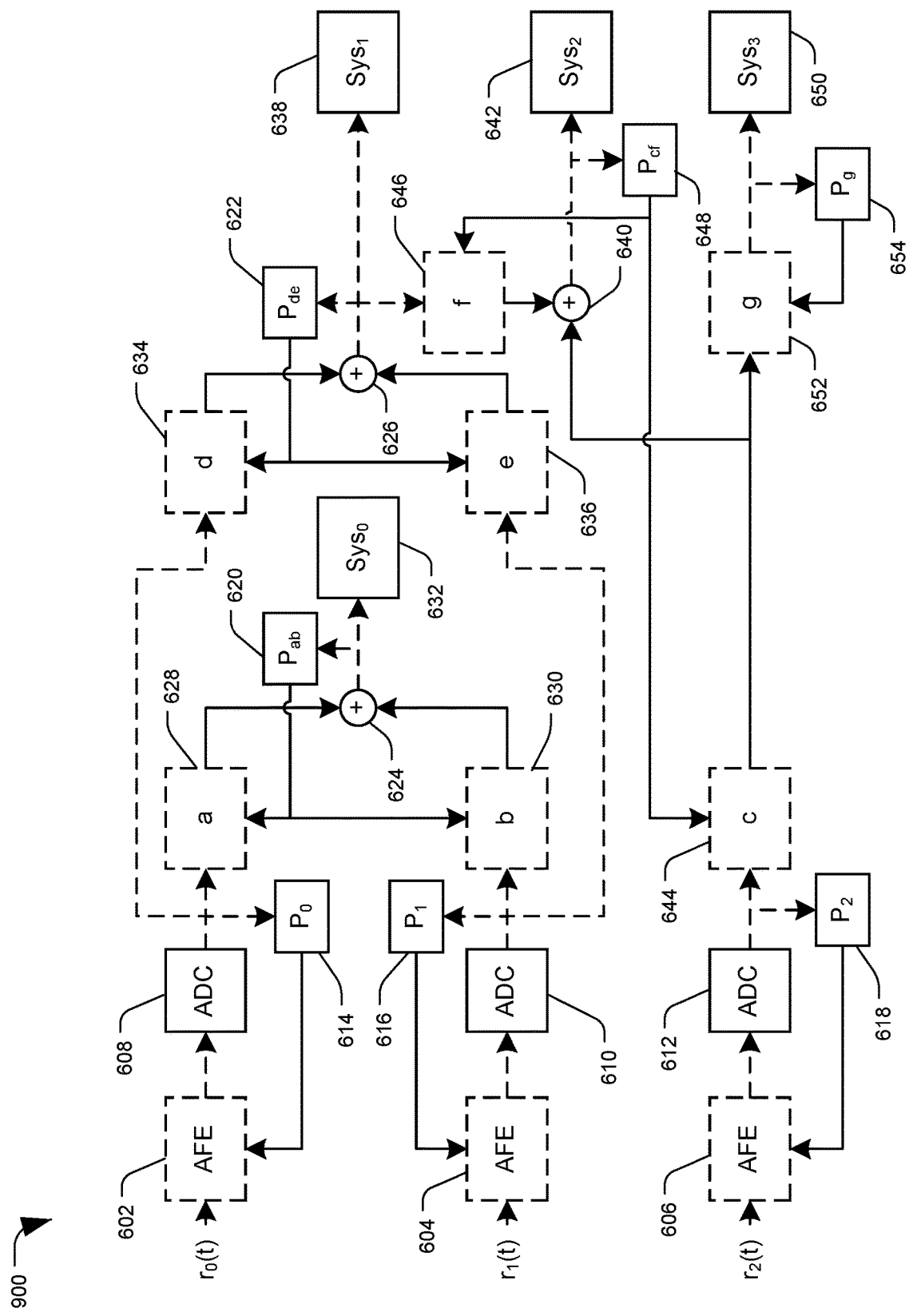
FIG. 9 is a diagram of a system configured for data path dynamic range optimization, in accordance with certain embodiments of the present disclosure.

The only remaining system for which the applied samples are not constrained is $Sys_3$ 650 which can be addressed in FIG. 9

FIG. 9 is a diagram of a system configured for data path dynamic range optimization, generally designated 900, in accordance with certain embodiments of the present disclosure. The system 900 may be another example of the systems of FIGS. 6 through 8, and accordingly corresponding elements may share the same numbers for simplicity.

In system 800 of FIG. 8, $Sys_3$ 650 was not constrained, and there was no filter capable of generating such a constraint that was not already committed to another constraint. Accordingly, in system 900, proposal 5) may be used to add filter g 652 before $Sys_3$ 650. Then proposal 4) may be used to add P block $P_g$ 654 to constrain filter g 652 and the input to $Sys_3$ 650. As shown, the input to all systems are now constrained and all of the five proposals have been applied to all locations of the data-path to which they would apply. In addition to the VGA control P blocks ($P_0$ 614, $P_1$ 616, and $P_2$ 618) to constrain the dynamic range of the ADCs, the proposed methodology included adding four P blocks ($P_{ab}$ 620, $P_{de}$ 622, $P_{cf}$ 648, and $P_g$ 654) and two filters (filter f 648 and filter g 652) to the data-path.

Although the examples of FIGS. 6 through 9 progressively added all the elements of the proposed methodology, it should be understood that systems may be design that only implement select proposals from the methodology and still fall within the scope of this disclosure. Further, the arrangement of FIG. 9 is not unique among cases in which all proposals are implemented, and the proposals may be applied in a different order or to produce different configurations than those depicted in FIGS. 6-9. An example alternate arrangement is proposed in FIG. 10.

Figure 10:
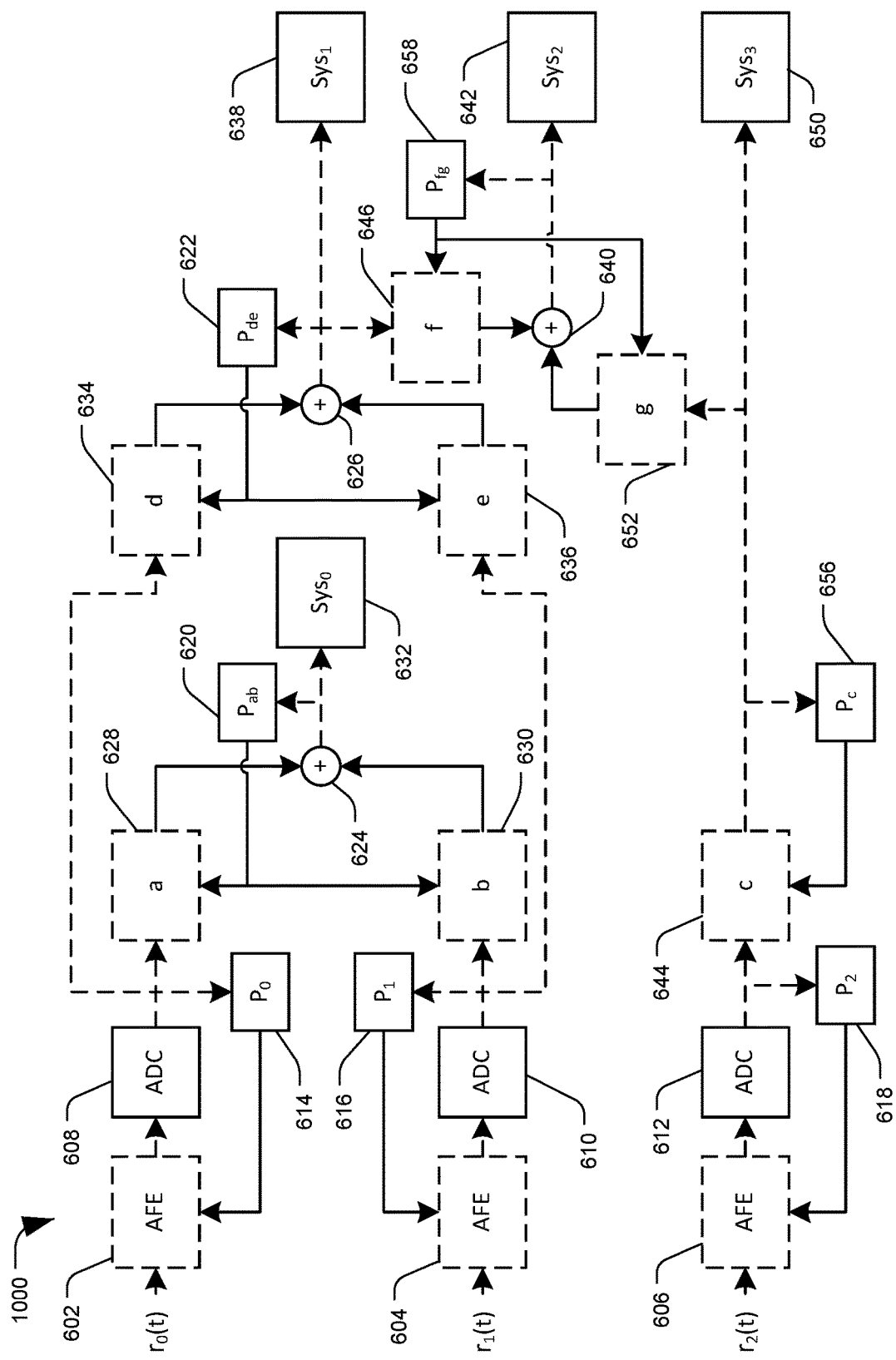
FIG. 10 is a diagram of a system configured for data path dynamic range optimization, in accordance with certain embodiments of the present disclosure.

FIG. 10 is a diagram of a system configured for data path dynamic range optimization, generally designated 1000, in accordance with certain embodiments of the present disclosure. The system 1000 may be another example of the systems of FIGS. 6 and 7, and accordingly corresponding elements may share the same numbers for simplicity.

The state of the system in FIG. 7 was that the input to $Sys_1$ 638 was constrained, but not the inputs to $Sys_2$ 642 and $Sys_3$ 650. Rather than jointly constraining filter c 644 and filter f 646 using P block $P_{cf}$ to constrain the input to $Sys_2$ 642 as in FIG. 8, instead proposal 4) may be applied to constrain filter c 644 to constrain the input to $Sys_3$ 650, as shown in FIG. 10. That is, in FIG. 10 filter c 644 may be individually constrained using P block $P_c$ 656 to correspond to the $Sys_3$ 650 input, instead of being jointly constrained to correspond to the $Sys_2$ 642 input as in FIGS. 8 and 9.

That would leave the input to $Sys_2$ 642 unconstrained, since the output of summing node 640 has not been constrained. Although both input paths to summing node 640 are already constrained (at filter c 644 and the output of summing node 626), those inputs are constrained for different systems. Therefore the output of the summing node 640 is not constrained, as there may be correlation between the input signals. For example, if the two inputs are of equal magnitude and opposite polarity, the output of the summing junction 640 would be zero. In the previous example of FIG. 8, adding filter f 646 and a P block $P_{cf}$ for filters f and c 644 allowed for constraining the input to $Sys_2$ 642; however, in this example, filter c 644 is already involved in a constraint and, thus, cannot be used. As such, proposal 3) may be applied to add filters f 646 and g 652 before the inputs to summing node 640, after which proposal 2) may be applied to add P block $P_{fg}$ 658 at the summing node 640 output to constrain both filters. In this manner, the input to $Sys_2$ 642 is also constrained.

The system depicted in FIG. 10 may be compared to the system in FIG. 9, each of which have data-paths constrained according to the proposed methodology and, thus, no additional rules remain to be applied. In both cases seven P blocks and two filters have been added to achieve this; however, the proposed rules were applied in a different order resulting in a different architecture of the data-paths. An example data storage device incorporating a read/write (R/W) channel configured for full utilization of a data path's dynamic range according to the proposed methodology is described in regard to FIG. 11.

Figure 11:
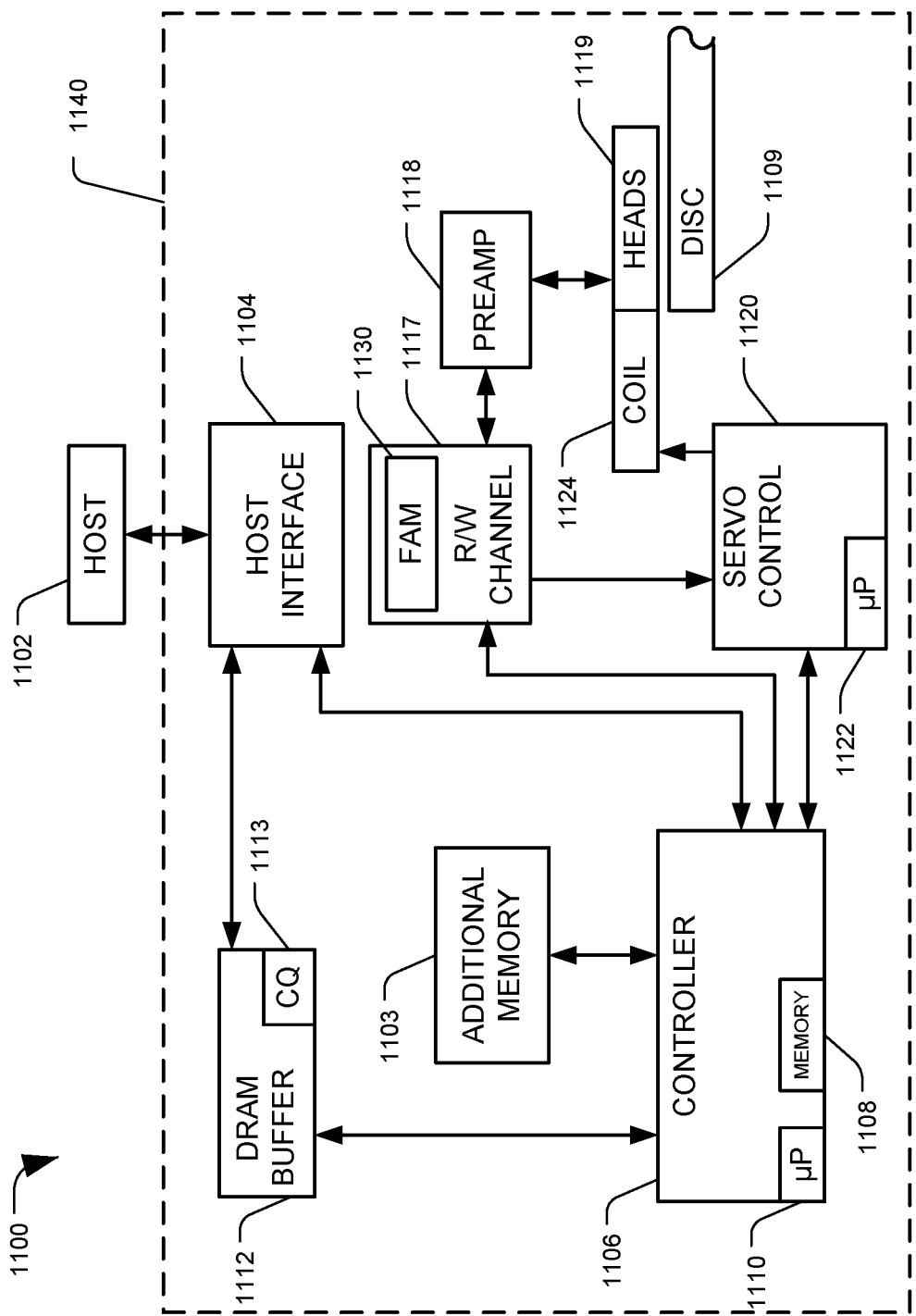
FIG. 11 is a diagram of a system configured for data path dynamic range optimization, in accordance with certain embodiments of the present disclosure.

FIG. 11 is a diagram of a system configured for data path dynamic range optimization, generally designated 1100, in accordance with certain embodiments of the present disclosure.

Specifically, FIG. 11 provides a functional block diagram of an example data storage device (DSD) 1100, which may be an example of the DSD 104 of FIG. 1. The DSD 1100 can communicate with a host device 1102 (such as the host system 102 shown in FIG. 1) via a hardware or firmware-based interface circuit 1104. The interface 1104 may comprise any interface that allows communication between a host 1102 and a DSD 1100, either wired or wireless, such as USB, IEEE 1394, Compact Flash, SATA, eSATA, PATA, SCSI, SAS, PCIe, Fibre Channel, Ethernet, or Thunderbolt, among others. The interface 1104 may include a connector (not shown) that allows the DSD 1100 to be physically removed from the host 1102. The DSD 1100 may have a casing 1140 housing the components of the DSD 1100, or the components of the DSD 1100 may be attached to the housing, or a combination thereof.

The buffer 1112 can temporarily store data during read and write operations, and can include a command queue (CQ) 1113 where multiple pending operations can be temporarily stored pending execution. Commands arriving over the interface 1104 may automatically be received in the CQ 1113 or may be stored there by controller 1106, interface 1104, or another component.

The DSD 1100 can include a programmable controller 1106, which can include associated memory 1108 and processor 1110. The controller 1106 may control data access operations, such as reads and writes, to one or more disc memories 1109. The DSD 1100 may include an additional memory 1103 instead of or in addition to disc memory 1109. For example, additional memory 1103 can be a solid state memory, which can be either volatile memory such as DRAM or SRAM, or non-volatile memory, such as NAND Flash memory. The additional memory 1103 can function as a cache and store recently or frequently read or written data, or data likely to be read soon. Additional memory 1103 may also function as main storage instead of or in addition to disc(s) 1109. A DSD 1100 containing multiple types of nonvolatile storage mediums, such as a disc(s) 1109 and Flash 1103, may be referred to as a hybrid storage device.

The DSD 1100 can include a read-write (R/W) channel 1117, which can encode data during write operations and reconstruct user data retrieved from a memory, such as disc(s) 1109, during read operations. A preamplifier circuit (preamp) 1118 can apply write currents to the heads 1119 and provides pre-amplification of read-back signals. In some embodiments, the preamp 1118 and heads 1119 may be considered part of the R/W channel 1117. A servo control circuit 1120 may use servo data to provide the appropriate current to the coil 1124, sometimes called a voice coil motor (VCM), to position the heads 1119 over a desired area of the disc(s) 1109. The controller 1106 can communicate with a processor 1122 to move the heads 1119 to the desired locations on the disc(s) 1109 during execution of various pending I/O commands in the command queue 1113.

DSD 1100 may include one or more filter adaptation modules (FAMs) 1130, for example in the R/W channel 1117, distributed among multiple components, as one or more stand-alone circuits, or any combination thereof. The FAM 1130 may perform the methods and processes described herein to constrain a dynamic amplitude range of a signal at strategic points through a data path such as the R/W channel 1117. For example, the FAM 1130 may include a P block as described herein configured to adapt a filter on the data path in order to adjust a signal amplitude and maximize the usage of the data path's range.

Although the foregoing examples provided herein are directed to R/W channels in a data storage device such as an MSMR disc memory device, the teachings are not limited thereto and can be applied to any data processing channel, and especially complex data channels. For example, the teachings may be applied to a device having multiple wireless signal antennae and a wireless signal processing channel configured to coherently combine the signals from the multiple antennae.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a data channel circuit configured to receive and process a signal to generate a bit sequence encoded in the signal, the data channel circuit including:
   an adaptation circuit configured to adjust an amplitude of the signal as it passes between components of the data channel circuit to constrain the amplitude of the signal when it is output from a first component to approximately match an amplitude range that a second component is configured to receive, the adaptation circuit including:
   a pulse response filter configured to generate a noiseless waveform of the signal based on an expected bit sequence for the signal;
   a summing node configured to combine an output of the pulse response filter and the signal received at the adaptation circuit to generate an error value based on a difference between the signal received at the adaptation circuit and the noiseless waveform;

a pulse response filter adaptation circuit configured to:
  receive the error value;
  adjust a coefficient of the pulse response filter to adjust the noiseless waveform for the signal; and
a gain control circuit configured to adjust an amplitude output of the first component based on the error value.

2. The apparatus of claim 1 further comprising:
the first component is a signal filter circuit configured to modify the signal based on coefficients of the filter; and
the adaptation circuit is configured to adjust the amplitude output of the first component by adjusting at least one coefficient value of the first component.

3. The apparatus of claim 1 further comprising:
the adaptation circuit further includes:
  a gain adaptation circuit configured to:
    receive the error value; and
    output a variable gain amplifier (VGA) control signal from the adaptation circuit to the first component to adjust the amplitude output of the first component, via a VGA gain applied by the first component to the signal, based on the error value.

4. The apparatus of claim 3 further comprising:
the adaptation circuit further configured to jointly adapt the pulse response filter and the first component to drive the error value towards zero.

5. The apparatus of claim 1 further comprising:
the data channel circuit further including:
  the first component, wherein the first component is an analog front end (AFE); and
  the second component, wherein the second component is an analog to digital converter (ADC).

6. The apparatus of claim 5 further comprising:
the data channel circuit is a read/write (R/W) channel of a multi-sensor magnetic recording (MSMR) data storage device configured to receive a plurality of signals corresponding to a plurality of read heads, the plurality of signals including the signal, wherein the data channel circuit includes:
a plurality of AFEs and ADCs corresponding to the plurality of signals, the plurality of AFEs and ADCs including the first component and the second component; and
a plurality of adaptation circuits configured to adjust amplitudes of the plurality of signals output from each of the plurality of AFEs to approximately matches amplitude ranges accepted by each of the corresponding plurality of ADCs.

7. The apparatus of claim 6 comprising the data channel circuit further including:
a second summing node configured to combine outputs from a first ADC and a second ADC of the plurality of ADCs and output a combined signal;
a second adaptation circuit configured to:
  receive the combined signal from the second summing node; and
  adjust amplitudes of a first signal sent from a first AFE to the first ADC and a second signal sent from a second AFE to the second ADC to set a dynamic amplitude range of the combined signal at an output of the second summing node by modifying a first coefficient of the first AFE and a second coefficient of the second AFE based on the combined signal.

8. The apparatus of claim 5 further comprising the adaptation circuit configured to set the amplitude of the signal when it is output from the AFE to be slightly in excess of the of the amplitude range accepted by the ADC to provide improved resolution for the signal around 0 millivolts (mV).

9. The apparatus of claim 1 further comprising the signal is received at the adaptation circuit from an output of the second component.

10. The apparatus of claim 1 further comprising:
the pulse response filter adaptation circuit is further configured to adapt a selected coefficient of the pulse response filter to fix an absolute sum of coefficients of the pulse response filter to a selected constant value K, in order to set the amplitude of the signal output from the first component to K through joint adaptation of the first component and the pulse response filter.

11. A method comprising:
constraining an amplitude of a signal to one or more selected amplitude ranges at selected points along a data channel circuit via addition of filter adaptation modules (FAMs), including:
configuring a FAM to constrain the amplitude of the signal via performing joint adaptation of:
  1) a filter providing the signal to the FAM, and
  2) a pulse response filter of the FAM configured to generate a noiseless waveform of the signal based on an expected bit sequence for the signal,
based on an error value generated from a difference between the signal received at the FAM and the noiseless waveform; and
adding a first FAM at the outputs of each analog-to-digital converter (ADC), with an output of the first FAM applied to an analog front end (AFE) that provides a first signal to the ADC, to control the amplitude of the signal output from the AFE and the ADC.

12. The method of claim 11 further comprising:
adding a second FAM at the outputs of each summing junction that sums outputs of at least two filters, with the output of the second FAM applied to the at least two filters, to control the amplitudes of the signals from the at least two filters to the each summing junction.

13. The method of claim 12 further comprising:
adding a first filter before each input to a first summing junction for which the input:
  does not already have a filter; or
  includes a filter whose amplitude output is already constrained by a FAM; and
adding the second FAM at the output of the first summing junction to control the amplitude of the signals from each filter that inputs a signal to the first summing junction.

14. The method of claim 13 further comprising:
adding a third FAM at the output of each unconstrained filter that provides an output to a signal processing circuit and whose output amplitude is not already constrained by an FAM, with the output of the third FAM applied to the unconstrained filter to control the amplitude of the signals from the unconstrained filter to the signal processing circuit.

15. The method of claim 14 further comprising:
adding a second filter before each signal processing circuit that:
  receives a signal that is not constrained by an FAM; and
  has no filter available to constrain via an FAM; and
adding the third FAM at the output of the second filter to control the amplitude of the signal from the second filter to a respective signal processing circuit.

16. An apparatus comprising:
a data channel circuit configured to process a plurality of signals, the data channel circuit including:
a first signal filter configured to adjust an amplitude of a first signal output from the first signal filter to a first input of a first summing circuit;
a second signal filter configured to adjust an amplitude of a second signal output from the second signal filter to a second input of the first summing circuit;
the first summing circuit configured to:
combine the first signal and the second signal to create a combined signal;
output the combined signal;
a pulse response filter configured to output a noiseless waveform signal to an error signal generation circuit;
the error signal generation circuit configured to:
receive the combined signal and the noiseless waveform signal;
output an error value based on a difference between the combined signal and the noiseless waveform; and
the data channel circuit is configured to adjust coefficients of the first signal filter and the second signal filter independently, based on the error value, in order to constrain the combined signal to a first selected amplitude range.

17. The apparatus of claim 16 further comprising the first filter and the second filter are arranged in parallel.

18. The apparatus of claim 17 comprising the data channel circuit further including:
a first adaptation circuit configured to:
receive the error value;
adjust the coefficients of the first signal filter based on the error value, without constraining the amplitude range of the first signal;
a second adaptation circuit configured to:
receive the error value;
adjust the coefficients of the second signal filter based on the error value, without constraining the amplitude range of the second signal; and
the first adaptation circuit and the second adaptation circuit configured to adjust the respective coefficients in order to constrain the combined signal to the first selected amplitude range.

19. The apparatus of claim 18 comprising the data channel circuit further including:
a pulse response filter adaptation circuit configured to:
receive the error value from the error signal generation circuit; and
adjust coefficients of the pulse response filter to constrain an amplitude of the noiseless waveform signal to a second selected amplitude range.

20. The apparatus of claim 19 comprising the data channel circuit further including:
a third signal filter, parallel to the first signal filter and the second signal filter, configured to adjust an amplitude of a third signal output from the third signal filter to a first input of a second summing circuit;
the first summing circuit configured to output the combined signal to the second summing circuit;
the second summing circuit configured to:
add the third signal to the combined signal to update the combined signal;
output the combined signal to the error signal generation circuit;
a third adaptation circuit configured to:
receive the error value;
adjust the coefficients of the third signal filter based on the error value, without constraining the amplitude range of the third signal; and
the first adaptation circuit, the second adaptation circuit, and the third adaptation circuit configured to adjust the respective coefficients in order to constrain the combined signal to the first selected amplitude range.

* * * * *